US008692233B2

(12) United States Patent
Choi et al.

(10) Patent No.: US 8,692,233 B2
(45) Date of Patent: Apr. 8, 2014

(54) BIOMOLECULE-BASED ELECTRONIC DEVICE

(75) Inventors: Jeong-Woo Choi, Goyang-si (KR);
Jun-Hong Min, Yongin-si (KR);
Byung-Keun Oh, Seoul (KR);
Hyun-Hee Kim, Daejeon (KR);
Young-Jun Kim, Seoul (KR)

(73) Assignee: Industry-University Cooperation Foundation Sogang University, Seoul (KR)

( * ) Notice: Subject to any disclaimer, the term of this patent is extended or adjusted under 35 U.S.C. 154(b) by 652 days.

(21) Appl. No.: 12/809,646

(22) PCT Filed: Apr. 17, 2008

(86) PCT No.: PCT/KR2008/002168
§ 371 (c)(1),
(2), (4) Date: Jun. 21, 2010

(87) PCT Pub. No.: WO2009/082064
PCT Pub. Date: Jul. 2, 2009

(65) Prior Publication Data
US 2010/0270543 A1   Oct. 28, 2010

(30) Foreign Application Priority Data

Dec. 22, 2007 (KR) .................. 10-2007-0135948

(51) Int. Cl.
*H01L 29/08* (2006.01)
*H01L 35/24* (2006.01)
*H01L 51/00* (2006.01)

(52) U.S. Cl.
USPC .......................................... 257/40; 257/642

(58) Field of Classification Search
USPC ................. 257/40, 642, E39.007, E51.027, 257/E51.038, E51.051, E51.052, E21.625, 257/E51.001, E21.045; 438/1, 99, 780, 438/FOR. 135; 252/1; 977/705, 714, 722, 977/729, 793, 940, 942, 945

See application file for complete search history.

(56) References Cited

U.S. PATENT DOCUMENTS 5,466,589 A * 11/1995 Olinger et al. ................. 435/174
5,506,420 A    4/1996 Kossovsky et al.
(Continued)

FOREIGN PATENT DOCUMENTS

JP     63-177452    *  7/1988

OTHER PUBLICATIONS

International Search Report from International Application No. PCT/KR2008/002168, dated Aug. 22, 2008.

*Primary Examiner* — Jae Lee
*Assistant Examiner* — Quovaunda V Jefferson
(74) *Attorney, Agent, or Firm* — Clark & Elbing LLP

(57) ABSTRACT

The present invention relates to a biomolecule-based electronic device in which the biomolecule with redox potential is directly immobilized on the substrate. The present invention enables to excellently exhibit the capability of a protein-based bio-memory device in which it is preferable to use the substrate on which cysteine-introduced recombinant proteins are effectively immobilized and a self-assembled layer (SAM) is fabricated. It becomes realized that a redox potential is regulated using intrinsic redox potential of the protein dependent on applied voltage. The present invention provides a novel operating method in which three potentials are applied throughout four steps. The present invention has some advantages of fabricating a protein layer in a convenient manner and inducing electron transfer by fundamental electrochemical or electronic operation. The method of this invention is considered as a new concept in the senses that intrinsic electron transfer mechanisms induced by natural-occurring biomolecules are used to develop an information storage device.

3 Claims, 12 Drawing Sheets

(56) References Cited

U.S. PATENT DOCUMENTS

| | | |
|---|---|---|
| 5,585,646 A | 12/1996 | Kossovsky et al. |
| 7,015,139 B2 | 3/2006 | Yamashita |
| 7,088,116 B1 | 8/2006 | Lin |
| 2004/0110009 A1* | 6/2004 | McGimpsey et al. ...... 428/411.1 |
| 2005/0020869 A1* | 1/2005 | Hainfeld et al. .................. 600/1 |
| 2006/0194343 A1* | 8/2006 | Martin et al. ................. 436/518 |
| 2013/0029396 A1* | 1/2013 | Choi et al. .................... 435/174 |
| 2013/0157335 A1* | 6/2013 | Choi et al. .................... 435/176 |

\* cited by examiner

BIOMOLECULE-BASED ELECTRONIC DEVICE

CROSS-REFERENCE TO RELATED APPLICATIONS

This application is the U.S. national stage filing under 35 U.S.C. §371 of international application PCT/KR2008/002168, filed Apr. 17, 2008, which claims benefit of Korean Patent Application 10-2007-0135948, filed Dec. 22, 2007.

BACKGROUND OF THE INVENTION

1. Field of the Invention

The present invention relates to a biomolecule-based electronic device.

2. Background of Technique

Since 1989, various principles of molecular electronics have been proposed as promising information storage concepts to overcome the physical and technical limits of conventional silicon-based memory concepts such as the regional charge trap and transfer (1-12). J. J. Hopfield et al. proposed an information storage device with a shift register memory concept. This concept utilized two main energy sources, the photon and the electron, in order to obtain simple switch-type memory characteristics (8). M. C. Hersam et al. showed that the electrical properties of a single molecule can be measured by high vacuum scanning tunneling microscopy (STM) in order to prove that a single molecule can be applied to silicon-based molecular electronic devices (9). D. F. Bocian et al. investigated the redox kinetics of the porphyrin-based molecule attached to the surface of Si (100) to demonstrate the hybrid molecular/semiconductor information storage device (10-13). The molecular information storage system can be directly incorporated to organic/bio-mimicking systems, as well as to bio-architectures such as neurosystems, if a memory element consists of a biomaterial. T. Aoki et al. recently proposed an information storage logic that was composed of DNA or enzymes (14). The possibility of encoding information in the base sequences of DNA was shown by the manipulation of DNA with enzymes or DNAzymes (15). The present inventors also investigated the shift register memory effects using the biomolecular hetero Langmuir Blodgett (LB) layer to achieve simple electronic functions of the molecular diode and switching device with photocurrent generation and a rectifying property (16, 17). However, the characteristics of memory device, including the "Read", "Write", and "Erase" functions, have not yet been demonstrated using well-defined proteins to sustain simple and stable information signals.

Throughout this application, various publications and patents are referred and citations are provided in parentheses. The disclosures of these publications and patents in their entities are hereby incorporated by references into this application in order to fully describe this invention and the state of the art to which this invention pertains.

DETAILED DESCRIPTION OF THE INVENTION

The present inventors have made intensive studies to develop various electronic devices using a biomolecule, particularly to realize a device with the properties of a memory device such as "Read", "Write" and "Erase". As results, we have discovered that a bio-memory device with the properties of "Read", "Write" and "Erase" could be provided using cysteine-introduced recombinant proteins with redox potentials which fabricates a self-assembled layer (SAM) by direct immobilization on substrates.

Accordingly, it is an object of this invention to provide a biomolecule-based electronic device.

Other objects and advantages of the present invention will become apparent from the following detailed description together with the appended claims and drawings.

In one aspect of this invention, there is provided a biomolecule-based electronic device, comprising a biomolecule with a redox potential directly immobilized on a substrate.

The present inventors have made intensive studies to develop various electronic devices using a biomolecule, particularly to realize a device with the properties of a memory device such as "Read", "Write" and "Erase". As results, we have discovered that a bio-memory device with the properties of "Read", "Write" and "Erase" could be provided using cysteine-introduced recombinant proteins with redox potentials which fabricates a self-assembled layer (SAM) by direct immobilization on substrates.

It is one of the most features of this invention to provide an electronic unit (i.e., an electronic device) by direct immobilization of a biomolecule with redox potentials on substrate surface.

According to a preferable embodiment, the biomolecule is a recombinant protein with redox potentials in which a cysteine residue is introduced to the N-terminal or C-terminal of the recombinant protein and the recombinant protein is directly immobilized on the substrate through linking of a thiol group of the cysteine residue.

It is another feature of this invention that the protein with redox potentials is utilized as biomolecules serving as a memory unit and a cysteine residue is additionally introduced into the N-terminal or C-terminal of the protein, generating the stable SAM on the substrate. The thiol group of the cysteine residue introduced enables to form a stable monolayer with predominant orientation on the substrate, preferably metal substrate and more preferably gold (Au) substrate.

According to a preferable embodiment, the number of the cysteine residue introduced to the recombinant protein is in the number of 2-10. The function of the cysteine residue as an anchoring region is significantly reduced where the number of the cysteine residue introduced is not more than 2 (i.e., 1). Where the number of the cysteine residue introduced is not less than 10, it is difficult to purify recombinant proteins due to the formation of disulfide bond between cysteine residues introduced and in addition, the function of the cysteine residue as the anchoring portion is remarkably reduced.

According to a more preferable embodiment, the number of the cysteine residue introduced to the recombinant protein is in the number of 2-3 and most preferably 2.

The immobilization of protein by a thiol group of cysteine introduced is expressed as a direct immobilization method in this specification. The term "direct immobilization" used herein means that a protein is directly immobilized on a substrate by a molecule(s) in the protein with no help of other linker.

The direct immobilization has advantages as follows: decrease in unnecessary resistance layers in electron transfer process and maximization of immobilization capacity under predetermined conditions.

A linker is most commonly used up to date as a technique to immobilize the proteins on the substrate. However, this method has disadvantages of (i) requiring much excessive processes, (ii) exhibiting low immobilization rate and (iii) generating the insulating effects of linker layers.

The direct immobilization of the present invention may overcome defects of conventional techniques.

The recombinant protein used as the memory unit in this invention includes any one of proteins with redox potentials enabling to accept or release an electron.

For example, the recombinant protein suitable to this invention includes, but not limited to, a metalloprotein comprising metal ion, flavodoxin, plastocyanin and thioredoxin.

According to a preferable embodiment, the recombinant protein with redox potentials includes a metalloprotein comprising metal ion, more preferably azurin, cytochrome a, cytochrome b, cytochrome c, cytochrome oxidase, catalase, nitrogenase, hydrogenase, glucose 6-phosphatase, hexokinase, alginase, nitrate reductase, urease, glutathione peroxidase, alcohol dihydrogenase, carbonic anhydrase or DNA polymerase, much more preferably azurin, cytochrome a, cytochrome b or cytochrome c and most preferably azurin.

The substrate used in the bio-memory device of this invention includes any one of the memory devices. According to a preferable embodiment, the substrate is metal, metal oxide, glass, ceramic, quartz, silicone, semiconductor, Si/SiO2 wafer, germanium, gallium arsenide, carbon, carbon nanotube, polymer, sepharose or agarose, more preferably metal and most preferably Au substrate.

The term "Au substrate" used herein refers to a substrate of which the surface is coated by gold.

The method to immobilize the cysteine-modified proteins on the substrate is described in the substantial Examples as follows: first of all, the substrate, most preferably Au substrate is annealed at high temperature and washed with piranha solution. The cysteine-modified proteins are dispersed on the surface of Au substrate and kept to stand for the formation of SAM on the substrate, obtaining a protein-immobilized substrate.

For immobilization of the cysteine-modified protein on the substrate, the optimal concentration of protein solution is in a range of 0.05-0.2 mg/ml, preferably 0.07-0.15 mg/ml and most preferably 0.09-0.11 mg/ml. The optimal immobilization time is in a range of 60-180 min, preferably 80-150 min and most preferably 110-130 min.

According to a preferable embodiment, the bio-memory device is operated by applying a reduction potential, an open circuit potential and an oxidation potential.

According to a preferable embodiment, the device further includes an electric field source.

It is one of features of this invention that the protein molecules are self-assembled on the surface of the substrate, preferably Au substrate through the cysteine residue (i.e., its thiol group) and utilized as a nano-scale information storage device using intrinsic electron transfer of protein dependent on the applied voltage.

For the protein-based bio-memory device of this invention operated electrically, the present memory device is composed of the following compositions as a reversibly changeable and electrically readable electronic device. The electronic device includes the substrate. The substrate is the same as described above and its surface is electrically coated with Au as described in the Examples below. The redox-active layers are formed on the substrate. The SAM of the cysteine-introduced recombinant proteins with redox potentials is used as the redox-active layer in the present invention. The redox-active layers are placed under constant electronic conditions (e.g., oxidation or reduction by the recombinant proteins). The electrode is connected to the redox-active layer. The present device includes the electric field sources (e.g., a voltage supply unit) linked to the substrate or electrode, or both. The flow of the electron is induced by the voltage or electric beam supplied by the electric field sources, representing the memory properties.

In the memory device of this invention constructed electrically, the present device includes (i) the substrate, (ii) the SAM as the redox-active layer which is immobilized on the substrate and contains the cysteines introduced to the recombinant protein with redox potentials, (iii) the electrode linked to the redox-active layer and (iv) the electric field source supplying the voltage or electric beam to the substrate and/or electrode.

Referring to illustrative examples constructed electrochemically, the bio-memory device of this invention is described as follows:

This invention relates to an information storage device enabling to change the oxidation and reduction state of proteins immobilized by adjusting the applying voltage according to an electrochemical method. The substrate containing the protein thin membrane is incubated in an electrolyte solution (e.g., a HEPES electrolyte). The substrate is operated by linking to a potentiostat as a working electrode and a reference electrode (e.g., Ag/AgCl) and a counter electrode (e.g., Pt) are incorporated into the electrolyte. The reference electrode is a standard to read the potential changes of the working electrode in the potentiostat to swap the voltage. The counter electrode is a passage of the electrons flowed by potential regulation of the potentiostat. Thus, a three-electrode system has been known to be one of most favorite systems in the field of electrochemistry. In a brief electrochemical system described above, the simple voltage-current curve is obtained using a cyclic voltammetry method. It was demonstrated that the properties of voltage-current described above are to be repeated not less than 1,000 times (FIG. 6). In addition, the open circuit potential is measured to investigate equilibrium potential of the electrochemical system constructed. It is considered as open circuit potential that constant potential difference is formed by intrinsic property of protein layer and electrolyte in voltage-unapplied state, i.e., circuit-broken state and particular potential is naturally reached at equilibrium in constructed system. Where the above principle is used reversely, system could be made close to artificial equilibrium state via applying open circuit potential to system when open circuit potential of single system is known. As set forth in more detailed, where protein is reduced by accepting electron from electrolyte by applying particular reduction potential to the protein layer, it could be appreciated that spare electron to be influxed is released through returning protein thin membrane to originally natural equilibrium state by applying an open circuit potential. On the contrary, where protein thin membrane is oxidized by releasing electron, it could be appreciated that electron to be effluxed is returned and original potential state is recovered by applying the open circuit potential, suggesting that the open circuit potential functions to read redox state of the protein layer.

BRIEF DESCRIPTION OF THE DRAWINGS

FIG. 2a represents an optimal immobilization concentration of cysteine-modified azurin. FIG. 2b represents an optimal immobilization time of cysteine-modified azurin. FIG. 2c indicates an optical thickness of surface plasmon resonance (SPR) spectroscopy to immobilized cysteine-modified azurin. FIG. 2d converts the result of FIG. 2c to a histogram.

FIG. 8a represents Two-State and FIG. 8b represents Three-State.

The present invention will now be described in further detail by examples. It would be obvious to those skilled in the art that these examples are intended to be more concretely illustrative and the scope of the present invention as set forth in the appended claims is not limited to or by the examples.

EXAMPLES

Experimental Materials And Methods

Figure 1:
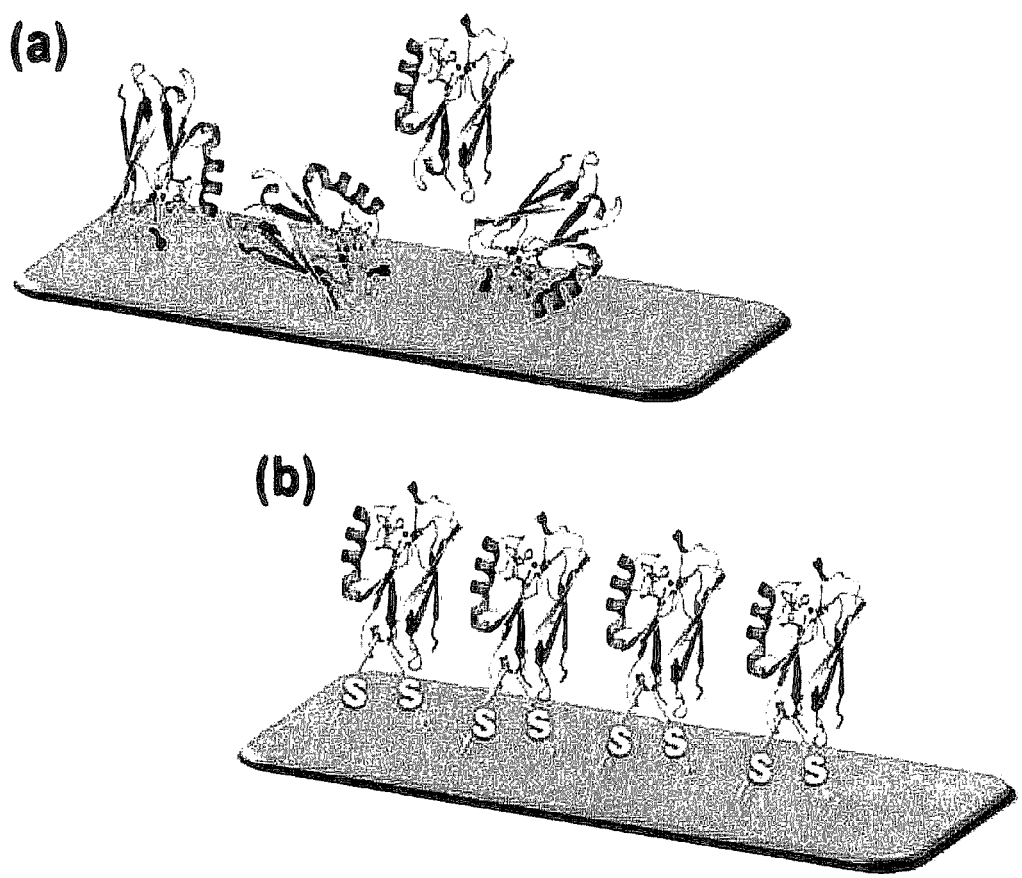
FIG. 1 schematically represents immobilization of cysteine-modified azurin. Each panel a and b indicate wild-type azurin and cysteine-modified azurin.

*P. aeruginosa* azurin is a 14 kDa electron transfer protein; azurins are a sub-class of the type 1 blue copper protein family. Although the physiological role of azurin has not been established, it most likely functions as a soluble electron carrier, transferring charges between redox partners in membrane or soluble conditions. From the previous research, it has also been shown that azurin can function as an electron donor or acceptor for nitrite reductase from *Pseudomonas*. One of the most important technologies to introduce protein to molecular electronics is the immobilization of protein possessing capabilities of its orientation and stability. The non-specific adsorption of protein on the gold surface prevents the orientation of protein. In this experiment, protein is immobilized through the cysteine-gold reaction by the introduction of two cysteine residues to the surface of azurin. The schematic diagram is presented in the FIG. 1 (S1-S6). Azurin proteins were immobilized on Au substrate with orientation of regular pattern.

The gold substrate was annealed by a rapid thermal annealing system (ULTECH co. Ltd, UTR-100 system) for 4 min at 400° C. The Au substrate was cleaned using piranha solution composed of 30 vol % $H_2O_2$ (Sigma-Aldrich Missouri USA) and 70 vol % $H_2SO_4$ (Duksan Chemical Co. Ltd, Republic of Korea) at 70° C. for 5 min, and the cleaned substrate was then immersed in pure ethanol solution for 1 hr. The electrochemical buffer used was 10 mM HEPES (Sigma, USA). The electrochemical reference electrode was Ag/AgCl (Bas, USA), and the counter electrode was Pt (Bas, USA). Distilled and deionized Millipore [(Milli-Q) water (DDW; >18MΩ)] was used in this experiment. Benzyl benzoate (Merck, Germany) was purchased and used as index matching fluid for SPR measurement.

Fabrication Optimization of Cysteine-Modified Azurin By Direct Immobilization The optimal azurin solution concentration was 0.10 mg/ml, and the optimal time for azurin immobilization was approximately 2 hrs. By observing the optical thickness of surface plasmon resonance (SPR) spectroscopy, it could be appreciated that the optical thickness of cysteine-modified azurin protein is thicker than that of wild-type azurin protein (cysteine-unmodified azurin).

The Surface Morphologies of the Cysteine-Modified Azurin Layer

The formation of the self assembled layer of recombinant proteins was investigated by surface plasmon resonance (SPR). Cysteine-modified azurin that was directly assembled on the gold surface was compared with wild-type azurin. Surface morphology was also measured by scanning tunneling microscopy (STM). FIG. 4-(a) shows the bare gold STM image, and FIG. 4-(b) shows the cysteine-modified azurin immobilized surface. In a 100 nm scale, immobilized cysteine-modified azurin assumes the form of small lumps, whereas adsorbed wild-type azurin covered the whole surface by forming the aggregates of 15-20 nm in height. Furthermore, it can be expected that cysteine-modified proteins are immobilized with good orientation, probably due to the effective linking of a thiol-group onto the Au surface.

Electrochemical Experiments

Electrochemical cells for the measuring cyclic voltammetry consist of working electrode, Ag/AgCl reference electrode and Pt counter electrode. The working electrode fabricated by immobilization of cysteine-modified azurin immobilized gold substrate. HEPES (pH=5.148) used as electrolyte. The redox reaction was reversible, which suggested that the self-assembled azurin maintains the reduction-oxidation properties. The scan range was from 500 mV to −100 mV with a 50 mV/s scan.

The Working Performance Design of the Bio-Memory Device

Figure 4A:
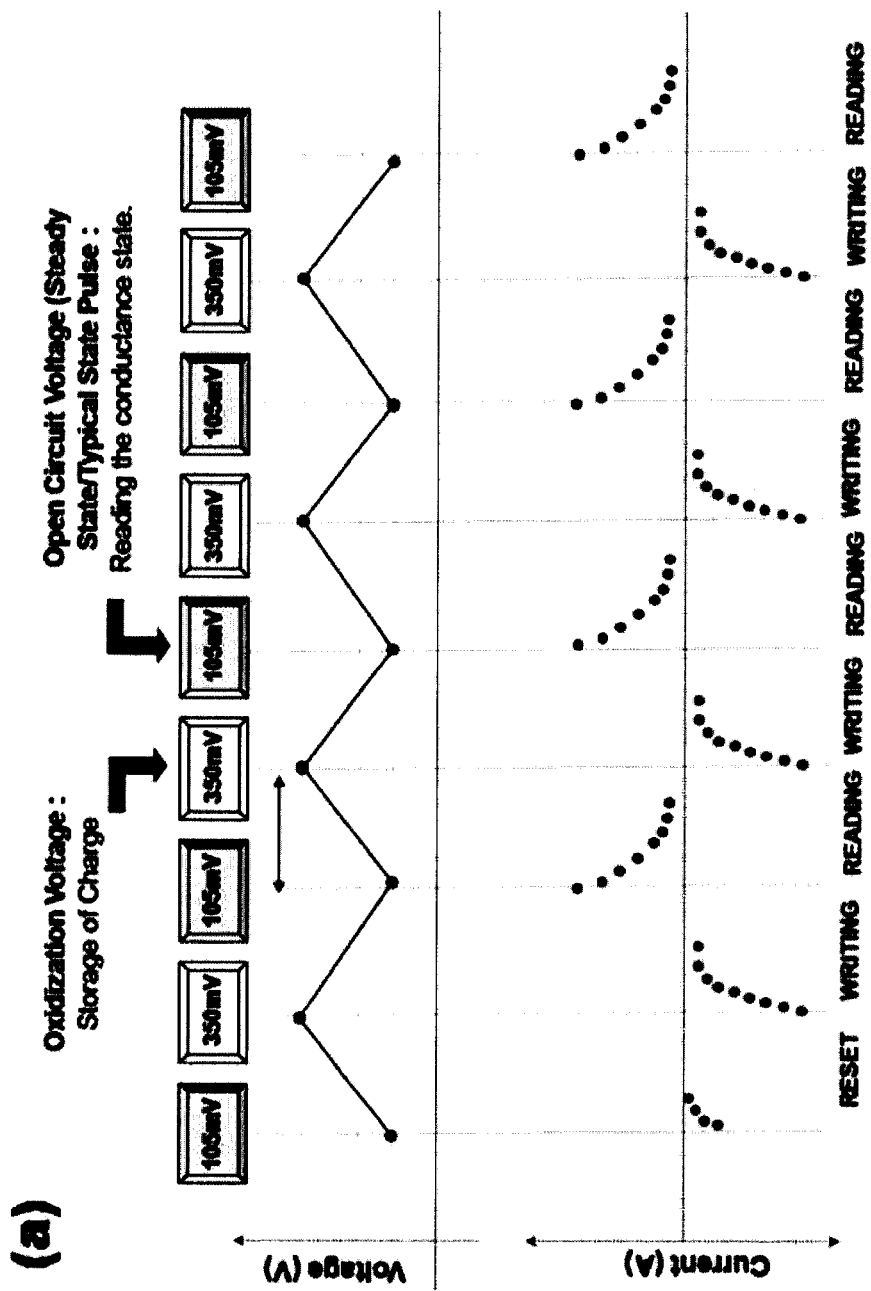
FIGS. 4a-4b schematically represent bio-memory device experiments. "Read" and "Write" function of cysteine-modified azurin assembled layer are indicated.
Figure 4B:
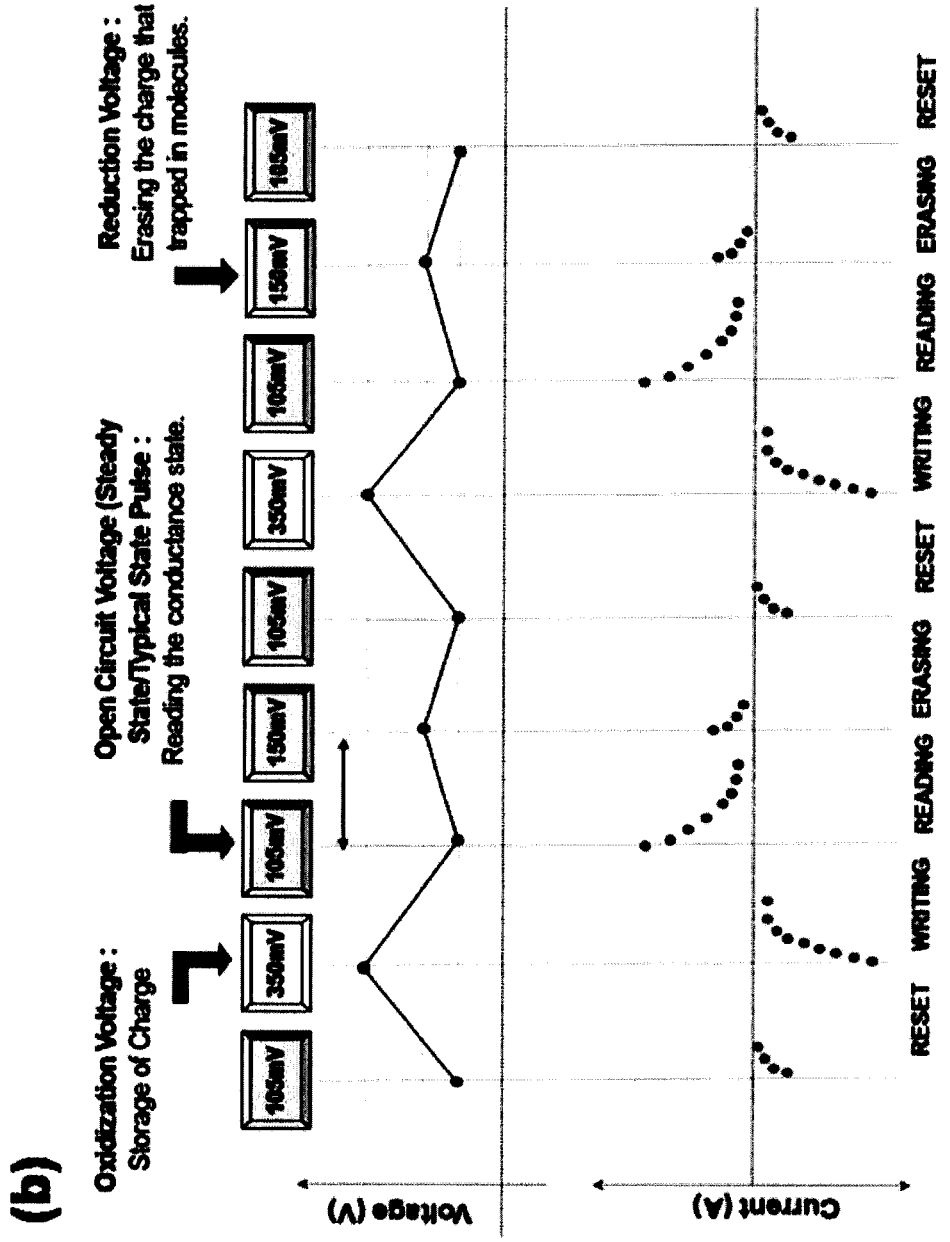
Figure 5A:
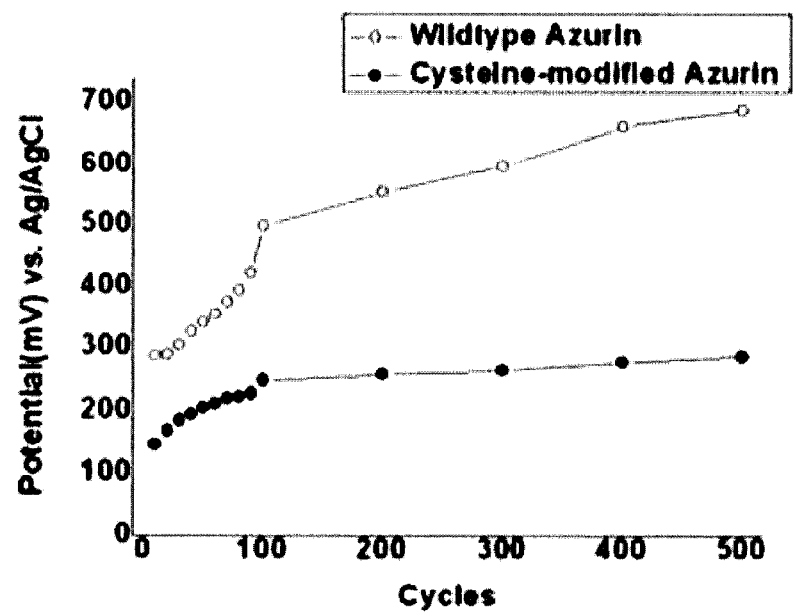
FIGS. 5a-5d shows graphs to an electrochemical stability of cysteine-modified azurin.
Figure 5B:
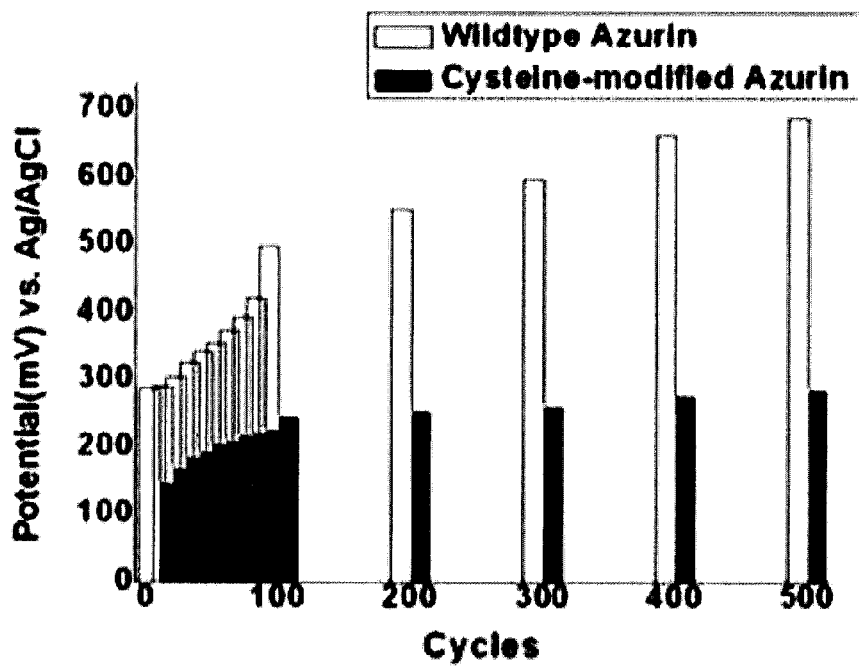
Figure 5C:
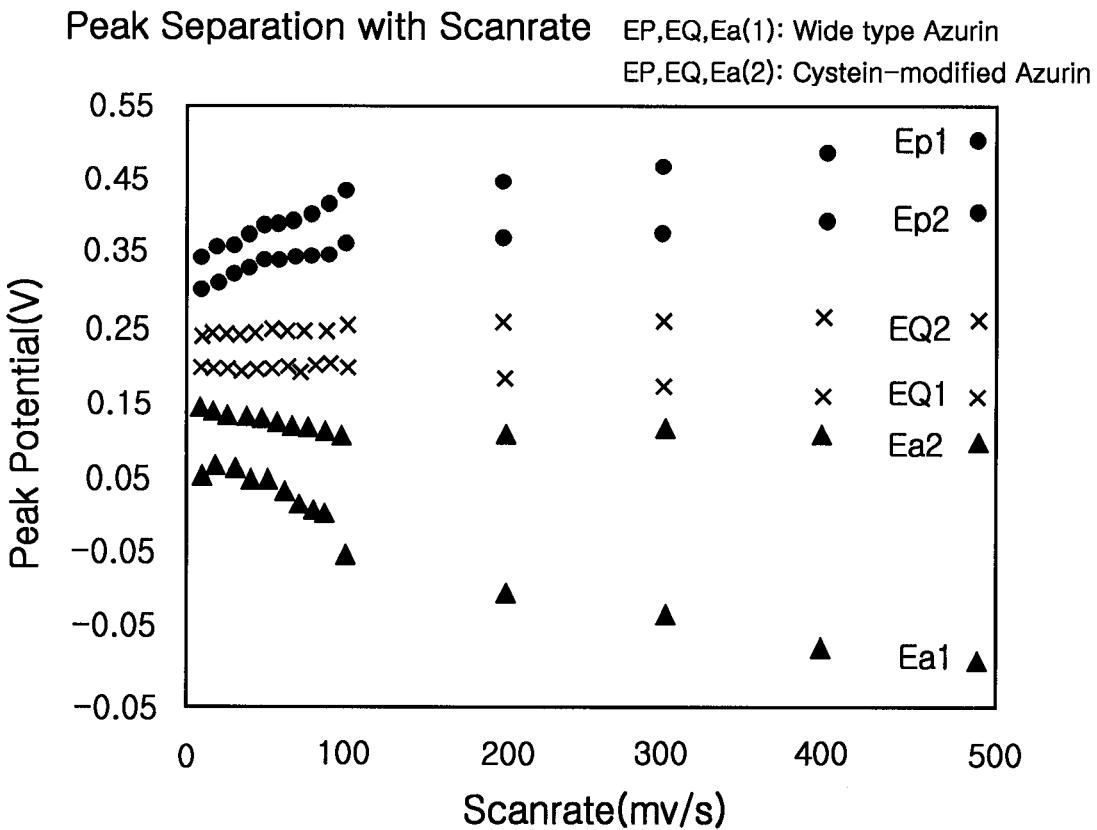
Figure 5D:
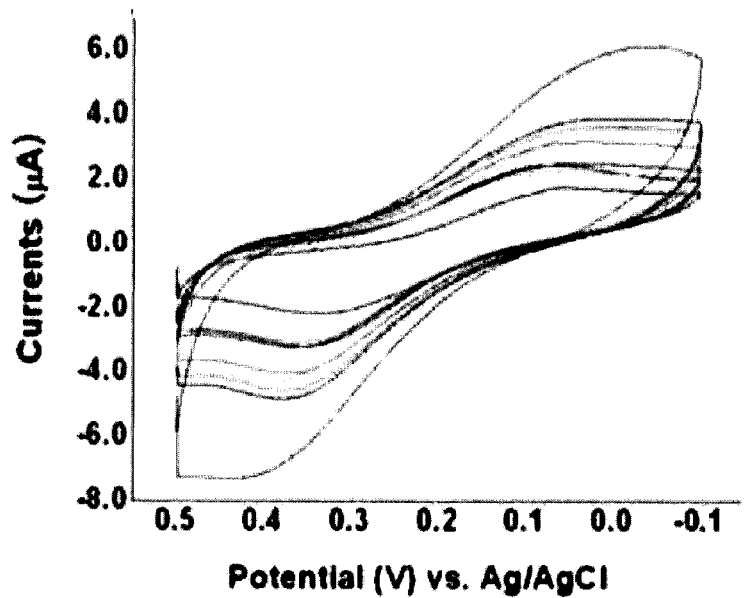

The schematic diagram for the validation of the bio-memory device principle is shown in FIG. 4a and FIG. 4b. The present inventors designed two methods with two stages ("Read" and "Write") or three stages ("Read", "Write", and "Erase") of working performance.

Open Circuit Voltage

Open Circuit Voltage (OCV) provided approaches to improve the S/N (signal to noise) in electrochemistry measurements. This method was described wherein the faradic current was temporally dissociated from the charging current associated with reading the charge of a redox species. The method of measuring OCV in electrochemical cell is as follows. Cell potential have initially poised at an arbitrary value. If the circuit were opened at the counter electrode for sufficient time to discharge the electrodes. And then the same potential have applied to the counter electrode, the circuit was closed and resulting current flow produced at the same time. If some voltage which is not OCV applied to the electrode, Current flowed to create electric field identical to that generated externally. The final approached voltages have defined the OCV (S7-S9). So the present inventors can conclude that OCV means the equilibrium state which is no current flowed. Namely, Applying OCV stands for drawing back original state.

Confirm the Electrochemical Stability of Cysteine-Modified Azurin

Peak separation is part of the basis for the electrochemical stability of materials. FIG. 5 shows the following results. The peaks of immobilized wild-type azurin separated rapidly with an increasing scan rate, but the cysteine-modified azurin only increased mildly. Peak separation of 'wild type azurin' and 'cysteine-modified azurin' as scanrate increasing presented in FIG. 5-(a). And this results was converted a bar graph in FIG. 5-(b). It means electrochemical stability of cysteine modified azurin as the present inventors can confirm FIG. 5-(c). Cyclic voltammogram of wildtype azurin also shows in FIG. 5-(d).

Experimental Results

The present inventors realize the concept of protein-based bio-memory devices motivated by previous works mentioned above, in which a single uniform metalloprotein (18, 19) can act as an individual memory element. Our approach to demonstrating the practical protein-based bio-memory device utilizing a protein as a memory element is the validation of an information manipulation principle and the robustness of a bio-device through the stable redox properties of a well-oriented immobilization layer using a recombination technique to compete with previously-demonstrated molecular electronic concepts.

The present inventors introduced two anchoring sites, cysteine residues (20-23), into *Pseudomonas aeruginosa* azurin to improve the uniformity of the protein monolayer on the gold surface because a wild-type form of the azurin was irregularly adsorbed to the gold surface via its exposed disulfide moiety (Cys3-Cys26). Cysteine-modified azurin was directly assembled on the gold surface by gold-thiol chemistry without any organic linker materials (24-26), which allowed us to achieve stable information reading and writing functions. The optimum immobilization condition was achieved.

Figure 6:
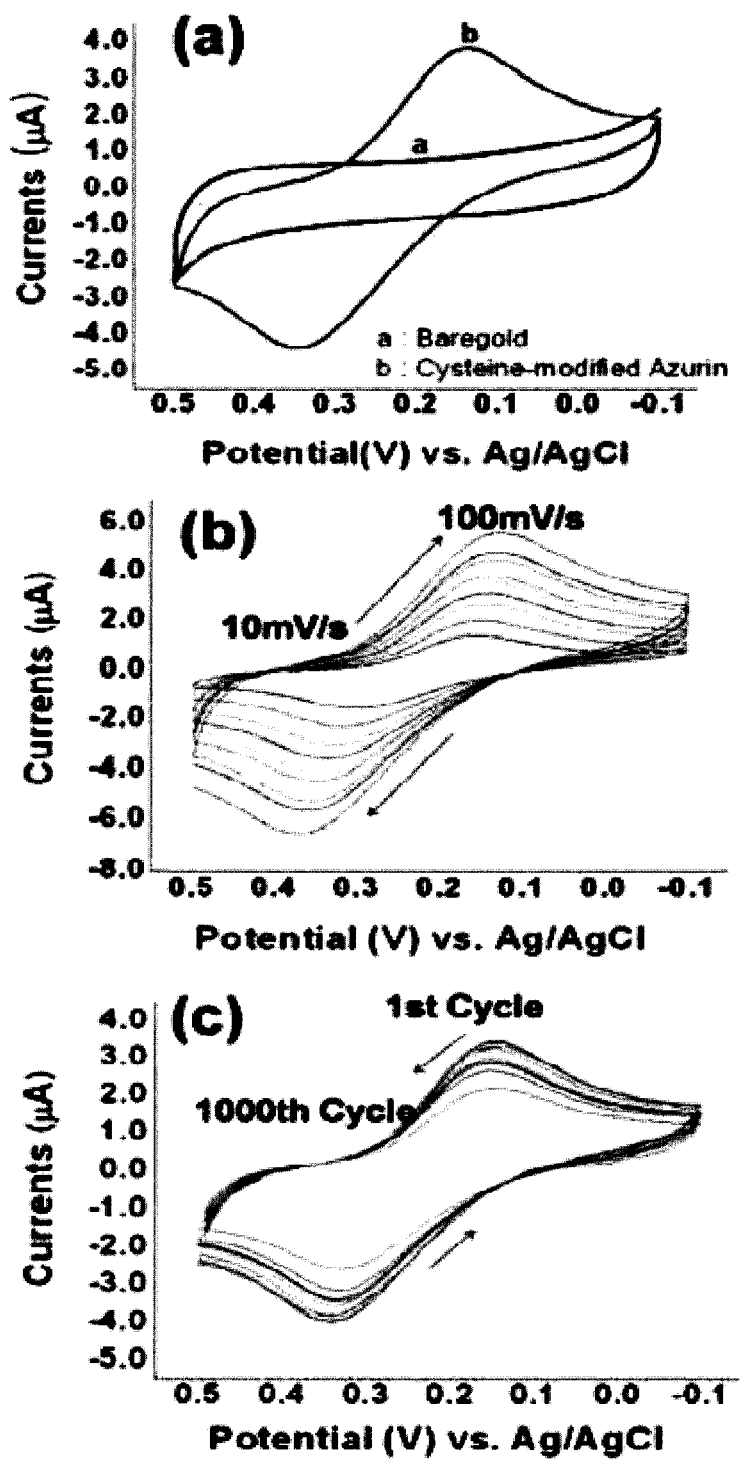
FIG. 6 shows a cycle voltammetry of cysteine-modified azurin immobilized on Au substrate. Panel a, cycle voltammetry at 50 mV/s (compared with bare gold electrode); panel b, cycle voltammetry at various scan; panel c, cycle voltammetry at 50 mV/s for $10^3$ cycles.

The redox property of the cysteine-modified azurin layer was investigated by the cyclic voltammetry method by well established electrochemical systems. As seen in FIG. 6, the reduction potential was 150 mV and the oxidation potential was 350 mV. Therefore, SRP (Standard Redox Potential) is calculated about 250 mV by the equation of (Ep+Ec)/2. Redox properties such as the standard redox potential were sustained under the repeat of over $10^3$ cycles in air.

Figure 2A:
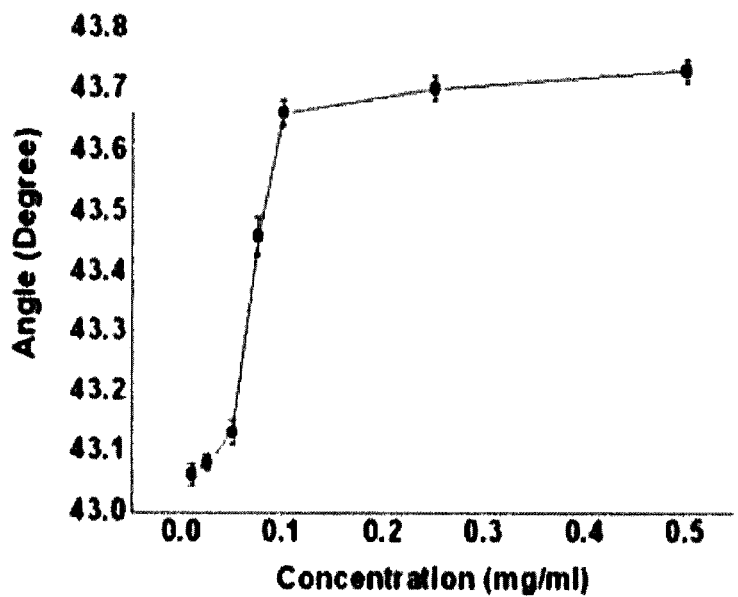
FIGS. 2a-2d represent a graph to cysteine-modified azurin immobilized under optimized conditions.
Figure 2B:
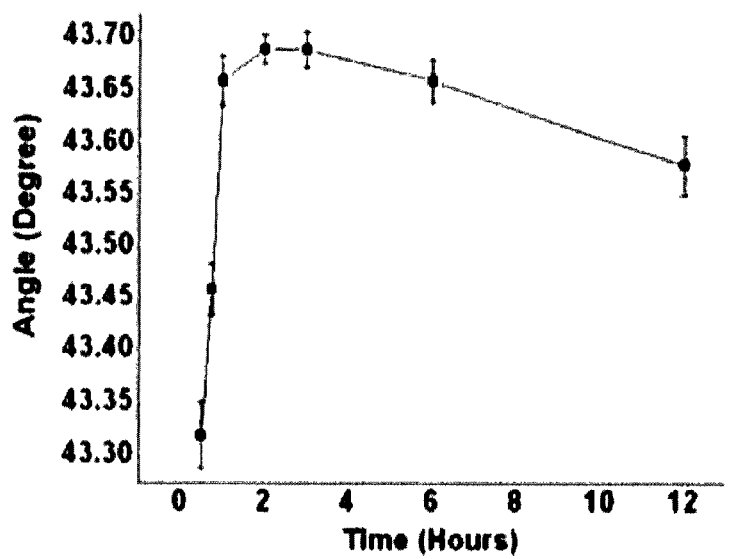
Figure 2C:
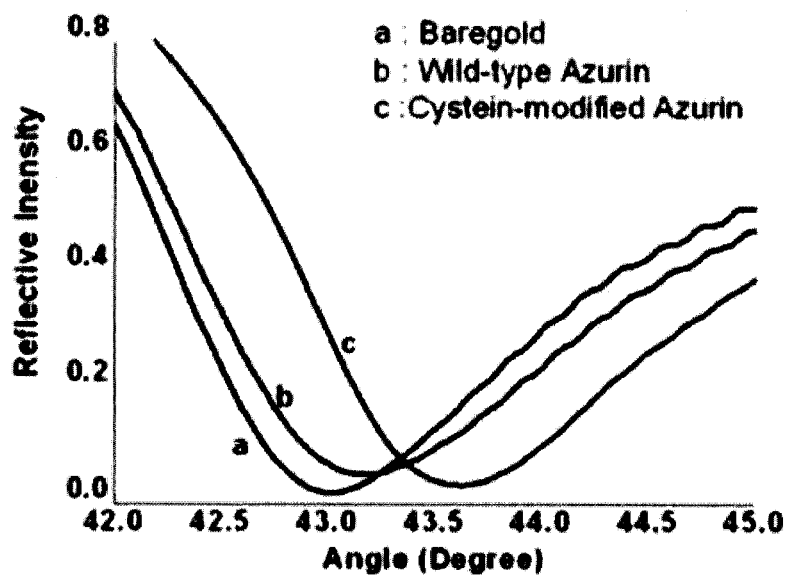
Figure 2D:
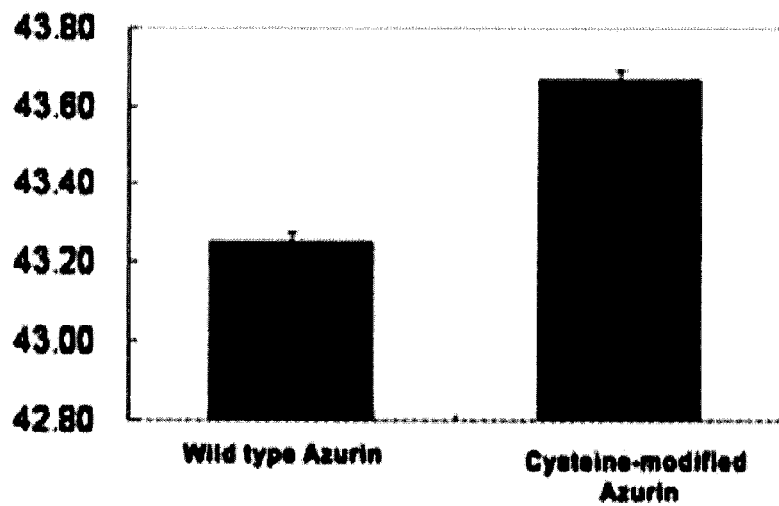
Figure 3:
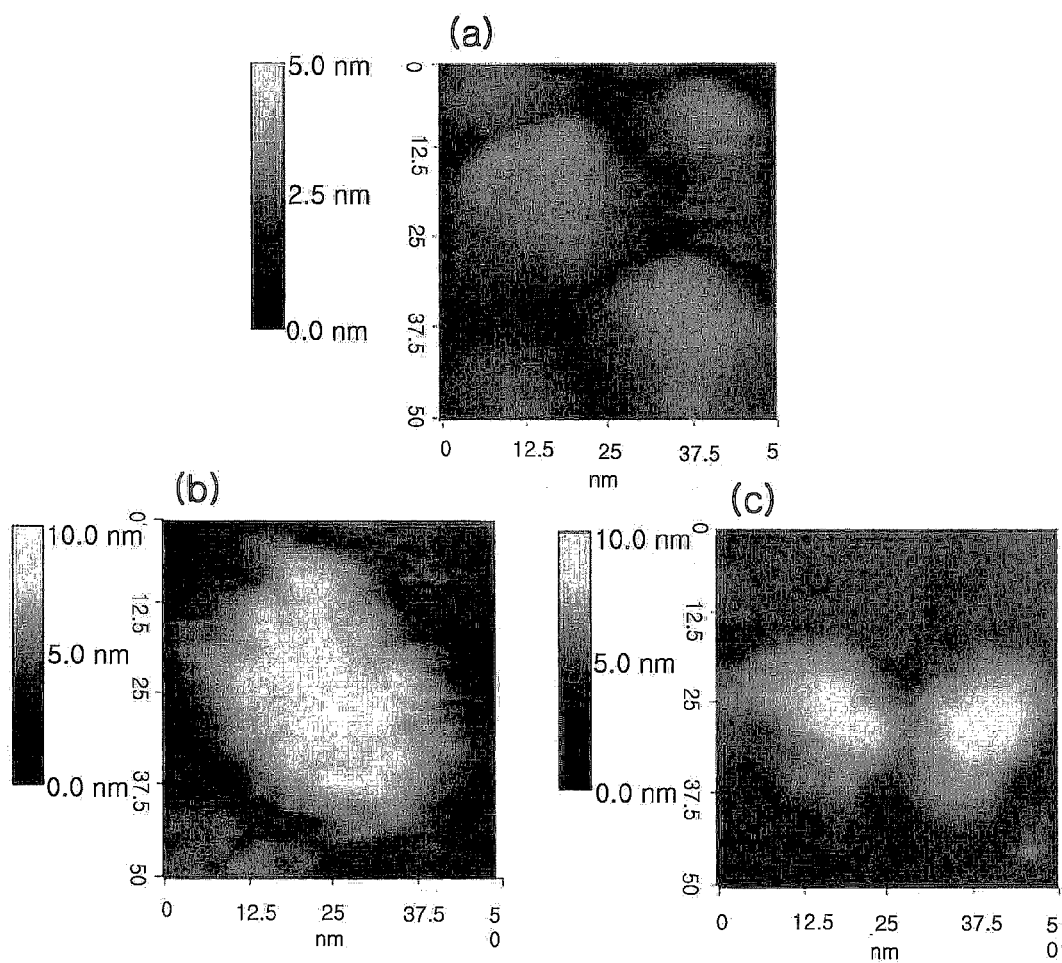
FIG. 3 represents photographs analyzing surface morphology of cysteine-modified azurin immobilized on Au substrate. Panel a, annealed Au substrate; panel b, surface with immobilized cysteine-modified azurin (high-density); panel c, surface with immobilized cysteine-modified azurin (low-density).
Figure 7A:
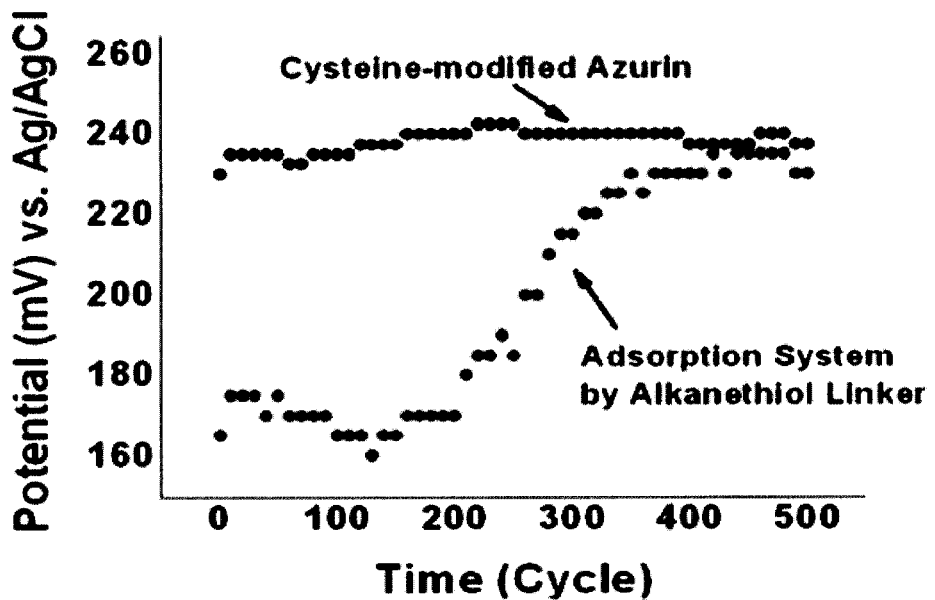
FIG. 7a represents standard oxidoreductive potential of cysteine-modified azurin for 500 cycles (10 mM HEPES). Cysteine-modified azurin; absorbed wild-type azurin.
Figure 7B:
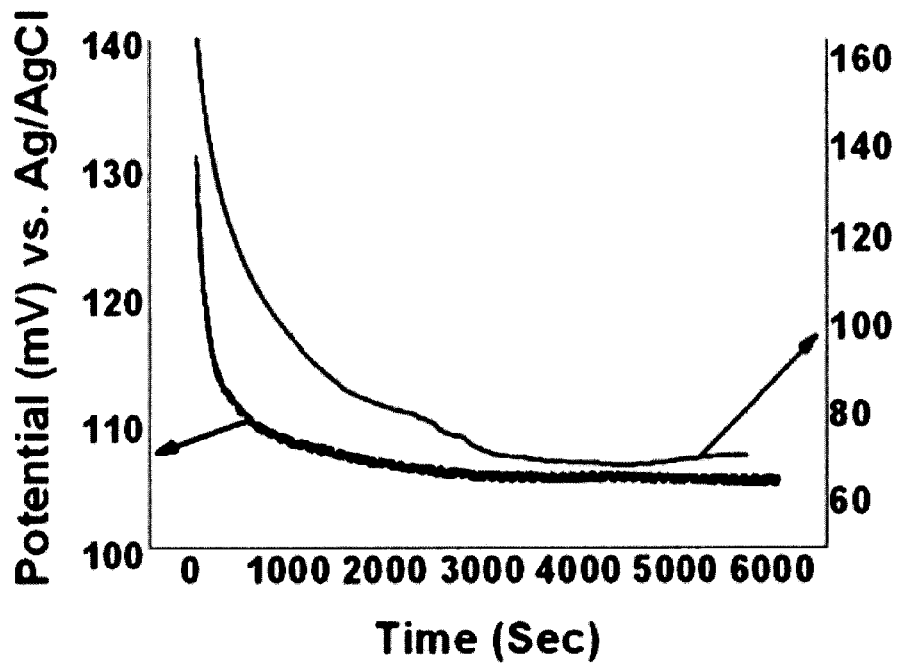
FIG. 7b is a graph representing open circuit voltage (OCV) of cysteine-modified azurin immobilized on Au substrate (10 mM HEPES). Cysteine-modified azurin (lower line, left axis); adsorbed wild-type azurin (upper liner, right axis).

As shown in FIG. 7, standard redox potential of the cysteine-modified azurin layer was 250 mV during $10^3$ cycles without any change, whereas that of the protein layer with chemical or physical adsorption by linking materials was changed from 170 mV to nearby 250 mV. These results include some points that are worth noting. The stable electrical properties of the azurin layer caused by the direct immobilization of cysteine-modified azurin imply that the direct immobilization technology can offer a very stable and well-oriented protein layer. In case of the use of the linker in the process of protein immobilization, incompletely immobilized protein existed in the protein layer; this protein seems to be detached under a harsh condition (over 200 cycles). The existence of unstable protein on the layer can be confirmed by OCV (Open Circuit Voltage) measurement (FIG. 2b) because the stabilization time of OCV of the direct protein immobilization layer was shorter than that of indirect immobilization by the linker. The open circuit potential of the cysteine-modified azurin layer was 105 mV.

This enhanced stability of the direct immobilized azurin layer can be also validated with the change of the peak interval between the oxidation potential and the reduction potential along the cycle. In the case of wild-type azurin using non-specific adsorption, the peak interval was dramatically increased as the scan rate increased, while directly immobilized cysteine-modified azurin mildly increased (28). This peak interval of the directly immobilized cysteine-modified azurin layer was reduced during $10^3$ cycles because the electron transfer resistance is reduced as the cycles were repeated and the more reversible electrochemical reaction system is stabilized by strong direct immobilization due to the introduction of cysteine into the protein.

The present inventors have concluded that the directly immobilized azurin layer has three distinct conducting states. Appling of an oxidization voltage (350 mV) causes transfer of electrons from the immobilized azurin layer into the Au substrate, and positive charges stored in azurin layer. Reduction step was performed as a contrary concept. Reduction voltage (150 mV) occur electron transfer back into azurin layer, through erasing the stored charge. For reading these charged state, OCV have been used. Azurin reached a stable equilibrium state between assembled azurin and electrolytes when OCV was applied. If we apply the OCV to the reduced azurin, it will be oxidized and the electrons will be discharged according to the same principle with which the azurin reaches a state of equilibrium between two directional currents, one flowing into the electrode and the other flowing out of the electrode equally and naturally when no voltage was applied to the system. Therefore, the OCV state can be utilized as a reading step of the memory device in the system. These three states are the basis of the OCPA (Open Circuit Potential Amperometry) experiment.

Figure 8A:
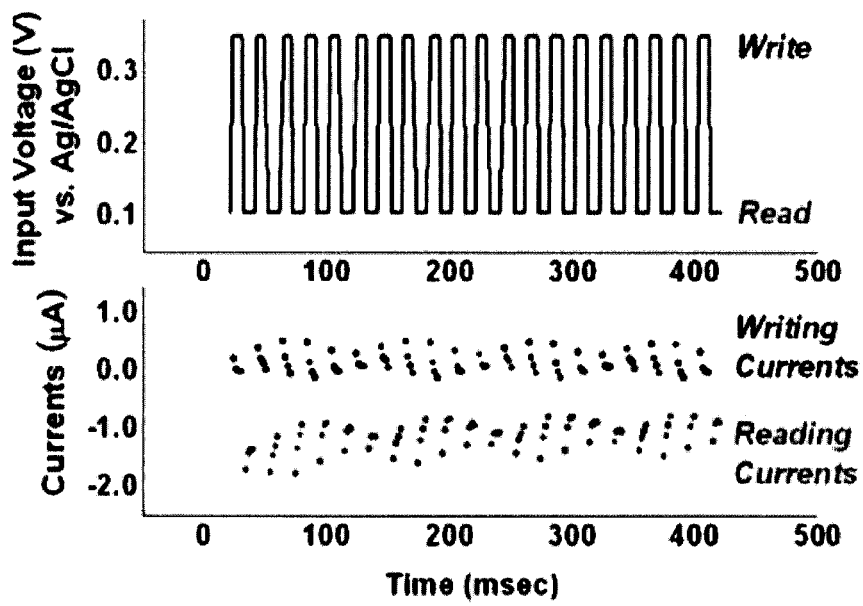
FIGS. 8a-8b shows results indicating OCPA of cysteine-modified azurin immobilized on Au substrate (10 mM HEPES).
Figure 8B:
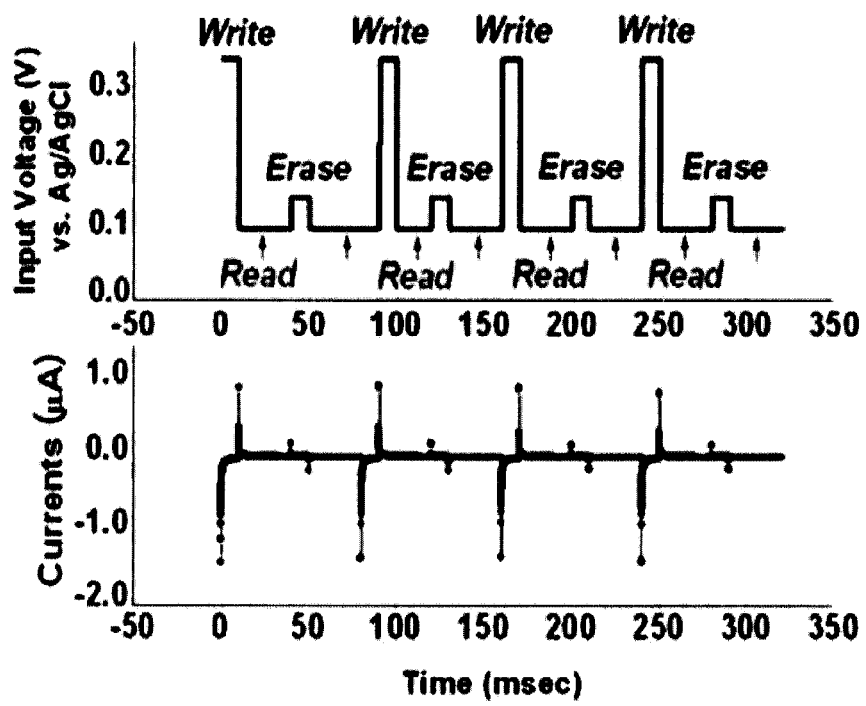

The chronoamperometry (CA) method is an electrochemical technique in which the potential of the working electrode is stepped, and the resulting current from faradaic processes occurring at the electrode (caused by the potential step) is monitored as a function of time. The application of the oxidation voltage and measurement of the current was defined as the 'Write' step (Electron inflow). The application of open circuit voltage and measurement of conducted current was defined as the 'Read' step (Electron outflow). Like this, the oxidization voltage and OCV were applied to the assembled azurin layer one after the other, and switching of the 'Write' and 'Read' functions could be repeated (29). Furthermore, 'Reduction Potential' plays a role as an artificial 'Erase' step by releasing all of the trapped charges. Therefore, we can store/read/release information by regulating cysteine-modified azurin with these three conducting states (At 350 mV, at 105 mV, at 150 mV). The repeated "Read" and "Write" functions (2 stages) and the "Read", "Write", and "Erase" functions (3 stages) of the protein-based bio-memory device composed of a cysteine-modified azurin layer were investigated as shown in FIG. 8. The "Read" signal after the "Write" step was opposite that after the "Erase" step as shown in FIG. 8B, the results of which show that the bio-memory concept proposed here is well-validated. It is usually difficult for biomolecules, particularly proteins, to be introduced to electronic devices because of their intrinsic problems, including their instabilities.

Figure 9:
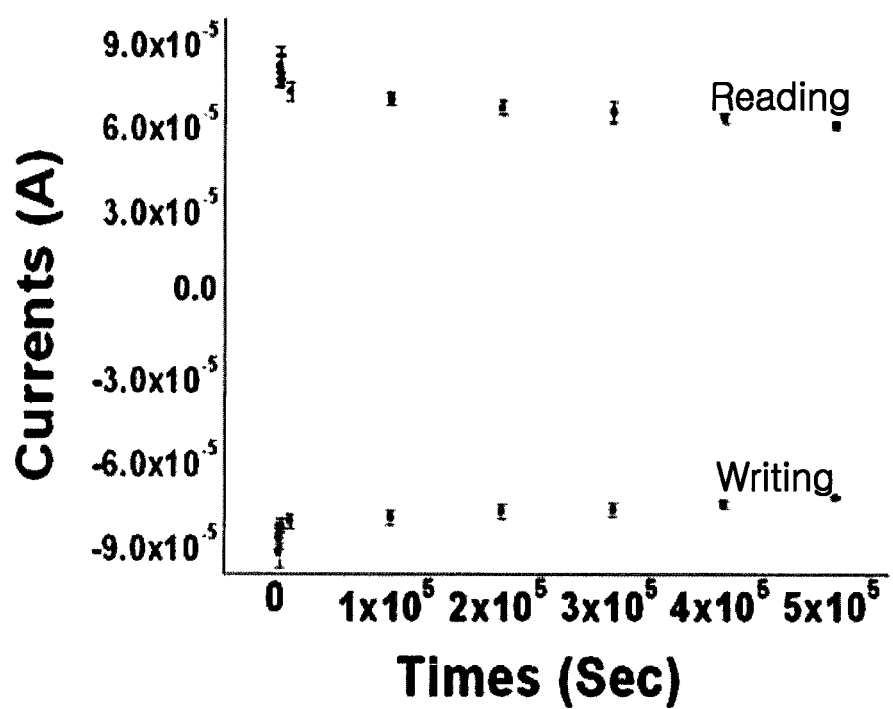
FIG. 9 represents 500,000-step switching validation.

The present inventors examined the robustness of the developed protein-based bio-memory device by repeatedly cycling the conducting of the azurin ("Write" step) and the release of electrons from the azurin ("Read" step). This was measured in 500,000 steps (FIG. 9). The magnitudes of currents at the write step and equilibrium step were well-sustained over 500,000 cycles. It is usually difficult for biomolecules, particularly proteins, to be introduced to electronic devices because of intrinsic problems with these biomolecules, such as their instabilities, which increase when protein is immobilized. However, direct immobilization by the introduction of cysteine to protein enhances the stability of the azurin immobilized on the gold surface. This implies that biomolecules with various functions can be applied to electronic devices to achieve bio-memory devices with functions and ultra-high density equivalents to the brain or retina.

As described above, this invention enables to excellently exhibit the capability of bio-memory devices using the substrate on which a cysteine-introduced recombinant protein is effectively immobilized and self-assembled layer is fabricated. It becomes realized that a redox potential is regulated using intrinsic redox potential of the protein dependent on applied voltage. The present invention provides a novel operating method in which three potentials are applied throughout four steps. The present invention has some advantages of fabricating a protein layer in a convenient manner and inducing electron transfer by fundamental electrochemical or electronic operation. The method of this invention is considered as a new concept in the senses that intrinsic electron transfer mechanisms induced by natural-occurring biomolecules are used to develop an information storage device.

Having described a preferred embodiment of the present invention, it is to be understood that variants and modifications thereof falling within the spirit of the invention may become apparent to those skilled in this art, and the scope of this invention is to be determined by appended claims and their equivalents.

REFERENCES

S1. J. Sambrook, E. F. Fritsch, T. Maniatis, Molecular Cloning, third ed., Cold Spring Harbor Laboratory Press, New York, (1989)
S2. M. Kamp, F. C. Hali, N. Rosato, A. F. Argo, G. W. Canters, *Biochim. Biophys. Acta,* 1019, 283, (1990).
S3. T. L. Foley, M. D. Burkart, *Curr. Opin. Chem. Biol.,* 11, 12, (2007).
S4. M. Kamp, M. C. Silvestrini, M. Brunori, J. V. Beeumen, F. C. Hali, G. W. Canters, *Eur. J. Biochem.,* 194, 109, (1990).
S5. I. Pozdnyakova, P. W. Stafshede, *Biochemistry* 40, 13278, (2001).
S6. R. S. Czernuszewicz, G. Fraczkiewicz, A. A. Zareba, *Inorg. Chem.,* 44, 5745, (2005).
S7. B. E. Conway, L. Bai, D. E. Tessier, *Electroanal. Chem. Interfacial Electrochem.,* 161, 39, (1984).
S8. D. L. Short, S. G. S. Schell, *J. Phys. E,* 18, 79, (1985).
S9. K. M. Roth, J. S. Lindsey, D. F. Bocian, W. G. Kuhr, *Langmuir;* 18, 4030, (2002).
S10. J. Cheng, D. B. Robinson, R. L. Cicero, T. Eberspacher, C. J. Barrelet, C. E. D. Chidsey, *J. Phys. Chem. B,* 105, 10900, (2001).
S11. F. Cecchet, M. Marcaccio, M. Margotti, F. Paolucci, S. Rapino, P. Rudolf, *J. Phys. Chem. B,* 110, 2241, (2005)
S12. B. R. Crane, A. J. Di Billio, J. R. Winkler, H. B. Gray, *J. Am. Chem. Soc.,* 123, 11623, (2001)
S13. Q. Chi, J. Zhang, J. U. Nielsen, E. R Frills, I. Chorkendorff, G. W. Canters, Jens E. T. Anderson, J. Ulstrup, *J. Am. Chem. Soc.,* 122, 4047, (2005)
S14. Y. M. Bae, K.-W. Park, B.-K. Oh, W. H. Lee, J.-W. Choi, Colloids and Surfaces A: Physicochem. Eng. Aspects, 257-258, 19, (2005).
S15. K. L. Prime, G. M. Whitesides, *Science* 252, 1164, (1991).
1. C. P. Collier, J. O. Jeppesen, Y. Luo, J. Perkins, E. W. Wong, J. R. Heath, F. Stoddart, *J. Am. Chem. Soc.,* 123, 12632, (2001).
2. G. Y. Tseng, J. C. Ellenbogen, *Science,* 294, 1293, (2001).
3. Y. Huang, X. Duan, Y. Cui, L. J. Lauhon, K.-H. Kim, C. M. Lieber, *Science,* 294, 1313, (2001).
4. Jaap H. A. Smith, Stefan C. J. Meskers, Rene A. J. Janssen, A. W. Marsman, D. M. de Leeuw, *Adv. Mater.,* 17, 1169, (2005).
5. J. H. Schon, H. Meng, Z. Bao, *Science,* 294, 2138, (2001).
6. C. H. Van der val, M. D. Eisaman, A. Andre, R. L. Walsworth, D. F. Phillips, A. S. Zibrov, M. D. Lukin, *Science,* 301, 196, (2003).
7. I. Lee, J. W. Lee, E. Greenbaum, *Phys. Rev. Lett.,* 79, 3294, (1997).
8. J. J. Hopfield, J. N. Onuchic, D. N. J. Beratan, *Phys. Chem.,* 93, 6350, (1989).
9. N. P. Guisinger, N. L. Yoder, M. C. Hersam, *PNAS,* 102, 8838, (2005).
10. K. M. Roth, A. A. Yasseri, Z. Liu, R. B. Dabke, V. Malinovski, K.-H. Schweikart, L. Yu, H. Tiznado, F. Zaera, J. S. Lindsay, W. G. Kuhr, D. F. Bocian, *J. Am. Chem. Soc.,* 125, 505, (2003).
11. Z. Liu, A. A. Yasseri, J. S. Lindsay, D. F. Bocian, *Science,* 302, 1543, (2003).
12. K. M. Roth, J. S. Lindsay, D. F. Bocian, W. G. Kuhr, *Langmuir,* 18, 4030, (2002).
13. K. M. Roth, D. T. Gryko, C. Clausen, J. Li, J. S. Lindsay, W. G. Kuhr, D. F. Bocian, *J. Phys. Chem. B,* 106, 8639, (2002).
14. M. H. Capstick, W. R Marnane, R. Pethig, *IEEE Computer,* 25, 22, (1992).
15. Y. Weizmann, R. Elnathan, O. Lioubashevski, I. Willner, *J. Am. Chem. Soc.,* 127, 12666, (2005).
16. J.-W. Choi, Y.-S. Nam, S.-J. Park, W.-H. Lee, D. Kim, M. Fujihira, *Biosensor & Bioelectronics,* 16, 819, (2001)
17. J.-W. Choi, Y.-S. Nam, W.-H. Lee, D. Kim, M. Fujihira, *Appl. Phys. Lett.,* 79, 1570, (2001)
18. W. B. Adrian, *Current Separation,* 18, 47, (1999).
19. L. M. Utsching, D. L. Huffman, T. V. O'Halloran, *Acc. Chem. Res.,* 37, 439, (2004).
20. M. Bosch, M. Swart, J. G. Snijders, H. J. C. Berendsen, A. E. Mark, C. Oostenbrink, W. F. van Gunsteren, G. W. Canters, *Chem Biochem,* 6, 738, (2005).
21. I. Pozdnyakova, P. Wittung-Stafshede, *Biochemistry,* 40, 13728, (2001).
22. E. I. Solomon, K. Szilagyi, S. DeBeer George, L. Basumallick, *Chem. Rev.,* 104, 419, (2004).
23. O. Farber, I. Pecht, *J. Am. Chem, Soc.,* 114, 5764, (1992).
24. J. Cheng, D. B. Robinson, R. L. Cicero, T. Eberspacher, C. J. Barrelet, Christopher E. D. Chidney, *J. Phys. Chem. B,* 105, 10900, (2001).
25. F. Cecchet, M. Marcaccio, M. Margotti, F. Paolucci, S. Rapino, P. Rudolf, *J. Phys. Chem. B,* 110, 2241, (2005).
26. R. Rinaldi, A. Biasco, G. Maruccio, R. Cingolani, D. Alliata, L. Andolfi, P. Facci, F. De Rienzo, R. Di Felice, E. Molinari, *Adv. Mater.,* 14, 1453, (2002).

What is claimed is:

1. A biomolecule-based electronic bio-memory device, comprising an azurin recombinant protein directly immobilized on an Au substrate, wherein 2-3 cysteine residues are introduced at the C-terminus of the recombinant protein and wherein the recombinant protein is directly immobilized on the substrate through linking of a thiol group of each of said cysteine residues.

2. The biomolecule-based electronic bio-memory device of claim 1, wherein said azurin recombinant protein comprises 2 cysteine residues introduced at its C-terminus.

3. The biomolecule-based electronic bio-memory device of claim 1, wherein said azurin recombinant protein comprises 3 cysteine residues introduced at its C-terminus.

* * * * *